United States Patent [19]

Sequeira et al.

[11] Patent Number: 4,538,276

[45] Date of Patent: Aug. 27, 1985

[54] DIRECT MODULATION OF INJECTION LASERS

[75] Inventors: Hermann B. Sequeira, Baltimore, Md.; Jay E. Taylor, Elizabeth City, N.C.

[73] Assignee: University of Delaware, Newark, Del.

[21] Appl. No.: 402,299

[22] Filed: Jul. 27, 1982

[51] Int. Cl.³ .......................... H01S 3/02; H01S 3/19
[52] U.S. Cl. ........................................ 372/26; 357/74; 357/17; 372/44
[58] Field of Search .......................... 372/26, 43, 44; 332/7.51; 357/74, 81

[56] References Cited

PUBLICATIONS

Konnerth, K. and Lanza, C., "Delay Between Current Pulse and Light Emission of a GaAs Injection Laser", Appl. Phys. Lett., vol. 4, pp. 120-121, Apr. 1964.
Goldstein, B. and Welch, J., "Microwave Modulation of a GaAs Injection Laser", Proc. IEEE, vol. 52, p. 715, 1964.
Goldstein, B. and Weigand, R., "X-Band Modulation of GaAs Lasers", Proc. IEEE, vol. 53, p. 195, 1965.
Myers, R. and Pershan, P., "Light Modulation Experiment at 46 GH$_z$", J. Appl. Phys., vol. 36, pp. 22-28, Jan. 1965.
Ikagami, T. and Suematsu, Y., "Resonance-Like Characteristics of the Direct Modulation of a Junction Laser", Proc. IEEE(letters), vol. 55, pp. 122-123, Jan. 1967.
Takamiya, S. et al., "Amplitude-Modulation of Diode Laser Light in the mm-Wave Region", Proc. IEEE, vol. 56, pp. 135-136, 1968.
Ikegami, T. and Suematsu, Y., "Direct Modulation of Semiconductor Junction Lasers", Electron. Comm. (Japan), vol. 51-B, pp. 51-57, Feb. 1968.
Alferov, Z. I. et al., "Fiz. Tekh. Poluprov., vol. 3, p. 1328, 1969, also Sov. Phys.-Semicond., vol. 3, p. 1107, 1970.
Russer, P. and Schultz, S., "Direkte Modulation eines Doppel-Hetero-Strukturelasers mit einer Bitrate vo 2.3 Gbits/sec.", Arch. Elek. Ubertragung, vol. 27, pp. 193-195, Apr. 1973.
Schicketanz, D., "Modulation von Gallium Arsenid Laser Dioden", Siemens Forsch. Entwicklung, vol. 2, pp. 218-221, Aug. 1973.
Ozeki, T. and Ito, T., "Pulse Modulation of DH-(GaAl)As Lasers", IEEE J. Quantum Electron., vol. QE-9, pp. 388-391, Feb. 1973.
Yania, H., Yano, M. and Kamiya, T., "Direct Modulation of a DH Laser Using Schottky-Barrier-Gate Gunn-Effect Digital Devices", IEEE J. Quantum Electron., vol. QE-11, pp. 519-524, 1975.
Channin, D. J., "High Data-Rate Modulation of Laser Diodes", Proc. SPIE, vol. 224, Fiber Optics for Communication and Control, pp. 128-132, Apr. 1980.
Kobayashi, T. and Takahashi, S., "Dynamic Behavior of Buried Heterostructure Laser", Japan J. Appl. Phys., vol. 15, No. 10, pp. 2025-2026, Oct. 1976.
Goldstein et al., "X-Band Modulation of GaAs Lasers", Proc. IEEE, vol. 53, 1965, p. 195.
Carroll, "Short-Pulse Modulation of Gallium-Arsenide Lasers with Trapatt Diodes", Electronics Letters, vol. 9, No. 7, Apr. 5, 1973, pp. 166-167.
Lakshminarayana et al., "Modulation of Room-Temperature GaAs Lasers at X-Band Frequencies", Electronics Letters, vol. 14, No. 19, Sep. 14, 1978, pp. 640-641.

Primary Examiner—James W. Davie
Attorney, Agent, or Firm—Dean R. Rexford

[57] ABSTRACT

Modulation depths in excess of 50% are achieved in well designed devices employing a laser diode for the conversion of modulating microwave signals into optical signals, by providing for suppression of microwave signals adventitiously present in the optical signal.

2 Claims, 5 Drawing Figures

DIRECT MODULATION OF INJECTION LASERS

BACKGROUND AND PRIOR ART

This invention pertains to the direct translation of injected microwave signals to optical signals.

The possibility of transmitting very high density information, e.g., voice, video or mathematical, via optical fibers has been recognized for some years. Such speculative schemes generally comprise the use of a microwave-driven laser diode for converting a modulating microwave signal in the frequency range of 5 GHz or higher to an optical signal consistent with the input microwave signal. However, it is now generally agreed that such high density communication will come about only if substantially deeper modulation of the optical signal can be achieved while avoiding or at least greatly suppressing the distortion characteristic of present day devices. The expression "modulation depth", as used herein refers to modulation of signal intensity as defined by the known expression, $$\frac{1}{2} \frac{I\,\text{max.} - I\,\text{min.}}{I\,\text{av.}},$$

wherein I is the intensity.

In early cryogenic lasers, modulation at X-band (i.e. 8–12 GHz) frequencies was demonstrated by Goldstein et al, as reported in Proc. IEEE 53 195 (1965). At about the same time Myers et al reported modulation at frequencies as high as 46 GHz, in J. Appl. Phys. 36 22 (1965).

More practical room temperature continuous wave lasers were reported in 1969. Microwave modulation in such lasers, for example by Gunn oscillators, IMPATT or TRAPATT diodes, has since been carried out in specially designed cavities. However, the transmission of high-density optical signals was not realized because in all such devices the achievable depth of modulation was only a few percent.

The basic arrangement for direct modulation of a laser diode, to which this invention pertains, normally comprises d.c. biasing to a point above the lasing threshold in order to avoid a sharp discontinuity in the output near the threshold. Above the threshold, response is essentially linear in a well made diode.

It has been recognized for some time that increased modulation depth would depend on the prevention of microwave leakage to the bias circuitry and to other components. The former object has been met by high-pass and low-pass circuits, as known in the art. Specially designed microwave cavities have been employed to shield these peripheral circuits against microwave leakage, while still providing the necessary coupling of the laser diode to the modulating signal. For example, Carroll et al, in Electron. Lett. 9 166 (1973), described a cross-shaped coaxial cavity to couple a TRAPATT modulator to a laser diode, obtaining 180 ps. pulses of light at 1 GHz repetition rate. Similarly, Lakshminarayana et al in Electron. Lett. 14 640 (1978), described a device wherein a laser diode was mounted in a low capacitance package placed in an X-band coaxial cavity. The diode was driven by a 100 mW microwave signal from a Gunn oscillator to produce modulation at 10.6 GHz.

It appears not to have been recognized that in these devices undesirable leakage of the microwave signal through the optical channel could occur. The leaking microwaves might and probably did couple with other components of the assembly such as the power supply, to produce distorted signals which were superposed on the information signal. In experimental devices reported in the art, microwaves leaking through the optical channel probably coupled with the nearby detector. Modulation depths of only a fraction of a percent could be achieved with these art devices.

SUMMARY OF THE INVENTION

A device for producing a modulated optical signal characterized by a modulation depth of at least about 50%, is provided wherein microwave signals of frequency at least about 5 GHz are caused to impinge, optionally via an antenna, on a laser diode whereby said signals are translated, consistent with the microwave signal, to optical signal which leaves the device in an optical channel. Microwave signals leaking into the optical channel are, through critical selection of channel dimensions, caused to decay by essentially only nondissipative attenuation whereby the propagation of microwave signals adventitously present in the channel is suppressed, at least in part, without generating distorting signals.

Figure 1:
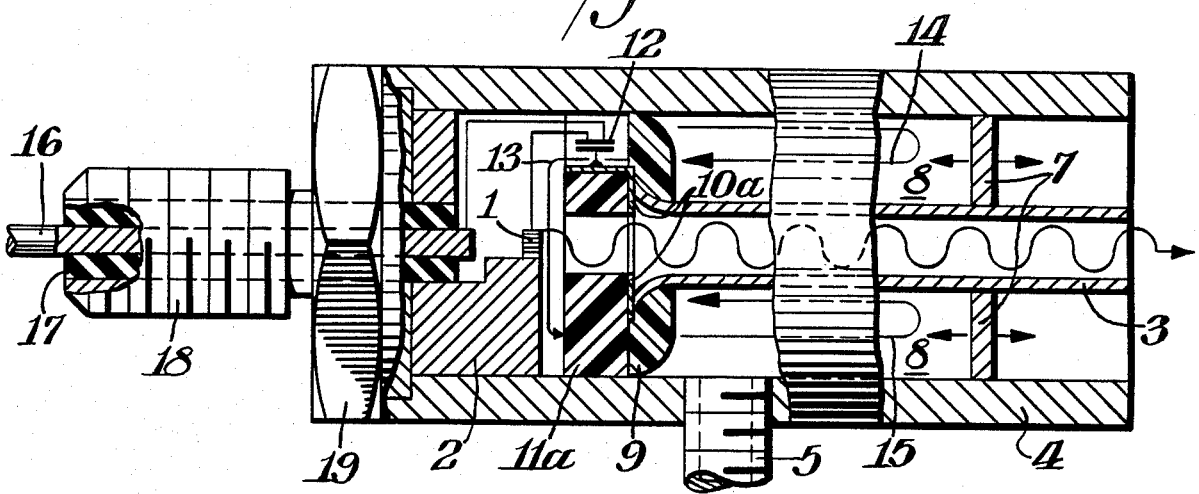
FIG. 1 is a schematic drawing showing a section along the principal axis of a device of the invention for modulating the optical output of an injection laser.
Figure 2:
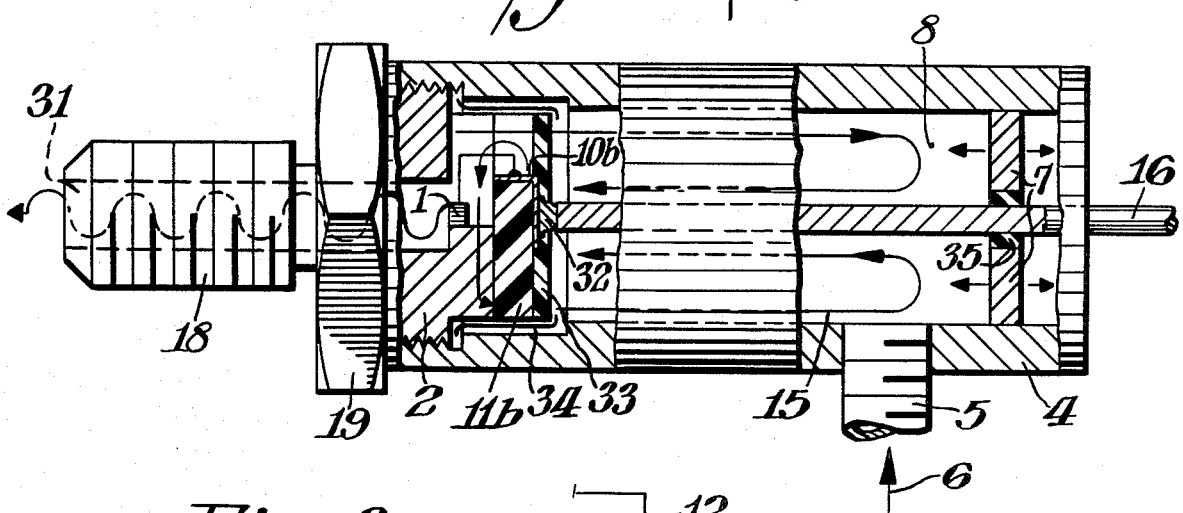

The device of FIG. 2, shown in similar fashion, is the same as that of FIG. 1 except that the emitted light leaves the device in a different manner.

Figure 3:
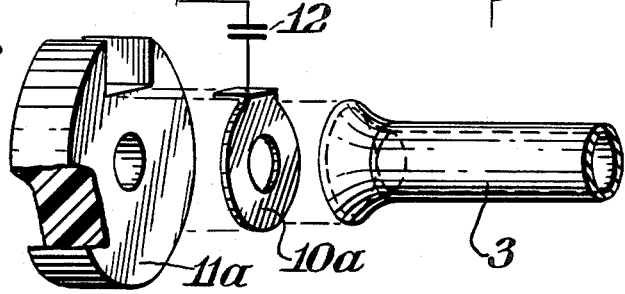
Figure 4:
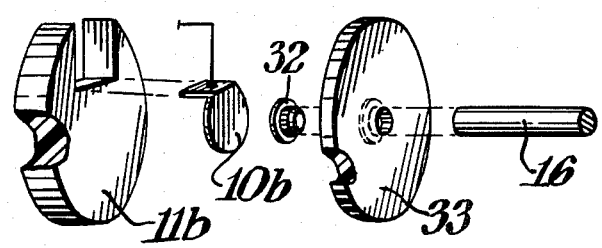

FIGS. 3 and 4 are exploded views showing the arrangement of some of the parts of FIGS. 1 and 2.

Figure 5:
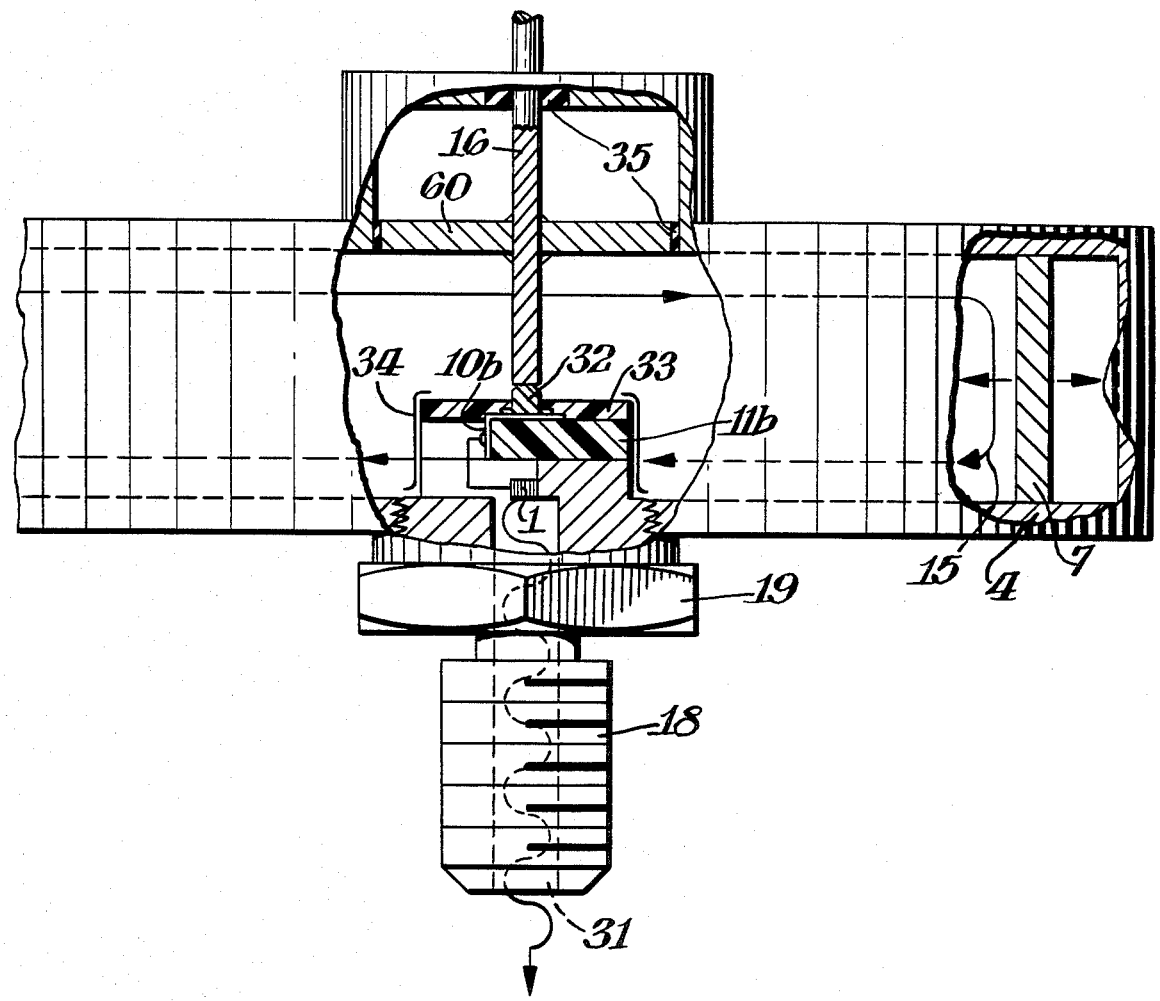

FIG. 5 shows an invention embodiment alternative to those of FIGS. 1 and 2.

DESCRIPTION OF THE PREFERRED EMBODIMENTS

It has now been found that minimization of microwave leakage into the optical output channel permits modulation in an injection laser to the extent of at least about 50% providing, of course, that other components of the device are selected and assembled according to good design practice.

Microwaves leaking through the optical channel are caused to decay by attenuation in the channel, through critical selection of channel dimensions. The attenuation of microwaves in channels of various cross sectional shape is known in the art. For a review of the topic see, for example, Marcuvitz (Ed.), Waveguide Handbook, Dover Publications, Inc., New York, N.Y. (1951). Such attenuation has not been applied to the optical output of injection lasers and, as has now been found, it is lack of this stratigem which in the past has prevented practical modulation depths in such lasers. It is, therefore, an object of this invention to provide such attenuation to the optical output of injection lasers whereby to permit modulation to a depth of at least about 50%.

The degree of attenuation is determined by the microwave power required to drive the diode, the amount of leakage of microwaves through the optical channel and the sensitivity of the optical receiver, for example at the opposite end of a coupled optical fiber transmission line. If, for example, a diode requires 3 mW of microwave power to modulate the optical output sufficiently, and the receiver has an overall sensitivity of 1 nW in the microwave region, the degree of attenuation needed is 3 mW/ 1 nW or about $3 \times 10^6$. Expressed in decibels (dB), as is conventional, the ratio is approximately 65 dB.

The cross sectional dimensions determine a cut-off wavelength, $\lambda_c$, above which transmission through a given length of channel rapidly approaches zero and the spatial decay rate approaches infinity. The decay per unit length of channel or spatial decay rate depends on the microwave signal wavelength, $\lambda_o$, and the cut off wavelength, $\lambda_c$, according to the equation (see Marcuvitz supra):

$$L(\text{dB/length}) = \frac{54.57}{\lambda_c}(1-(\lambda_c/\lambda_o)^2)^{\frac{1}{2}}$$

wherein L is the spatial decay rate.

The cut off wavelength, $\lambda_c$, varies with the cross sectional dimensions and cross sectional shape of the channel, as shown below.

| Cross Sectional Shape | Equation | Symbols |
|---|---|---|
| Circular | $\lambda_c = 1.706\ A$ | Wherein A is the inside diameter |
| Rectangular | $\lambda_c = 2\ A$ | Wherein A is the broadwall inside width. |

Other cross sectional shapes may be employed.

Having arrived at a decay rate, the required length of the optical channel is calculated as the quotient of the desired degree of decay, for example 65 dB, by the decay rate.

Thus, optimum channel length and dimensions can be selected for a given microwave signal frequency and degree of decay. In applications requiring the coherence properties of the laser, the length of the channel would be limited, of course, to the coherence length. Normally, the preferred method, is to choose the smallest cross sectional dimensions consistent with the emission properties (i.e. divergence) of the diode and the permitted mechanical and optical alignment tolerances. One normally employs the shortest channel which provides adequate decay.

If the channel is not lossless, some propagation below the cutoff wavelength, $\lambda_c$, may occur and the resultant attenuation is slightly different from that of the lossless case. The difference is normally not significant. Propagation in the lossy case is characterized by a propagation constant, $\beta$, which is given by:

$$\beta = \frac{2\pi}{\lambda_g}\sinh\frac{\sinh^{-1}\chi}{2}$$

wherein $$\chi = (\lambda_g/\lambda_o)\tan\delta$$

and tan $\delta$ is the effective loss tangent of the medium, always zero in vacuum. Attenuation, $\alpha$, is given by the equation $$\alpha = \frac{2\pi}{\lambda_g}\cosh\frac{\sinh^{-1}\chi}{2}$$

wherein $\lambda_g$ is given by the equation $$\lambda_g = \lambda_c/(1-(\lambda_c/\lambda_o)^2)^{\frac{1}{2}}$$

For example, at an operating frequency of 10 GHz ($\lambda_o = 3.0$ cm) in a cylindrical metallic channel having an inner diameter of 0.250 cm, $\lambda_c$ is 0.4265 cm ($1.706 \times 0.250$). Substitution into the above equations leads to an attenuation of 105 dB/cm for the lossless case, and 104 dB/cm for the lossy case. The propagation constant in the lossy case is about $10^{-4}$cm$^{-1}$. If the input microwave power is 1 mW, and the receiver sensitivity is $-100$ dBm, effective leakage suppression requires a channel at least about 1 cm.

Although these formulas have been developed to cover the case of the lossy dielectric, it may be readily extended to apply to conductive losses. Thus, if the metallic walls have a finite conductivity $\sigma$, the equivalent "loss tangent" of the medium at a radian frequency $\omega$, may be represented by $$\tan\delta = \frac{\sigma}{\omega\epsilon^1\epsilon_o}$$

where $\epsilon^1$ is the relative dielectric constant of the medium, and $\epsilon_o$ is the permittivity of free space.

FIG. 1 shows schematically a colinear embodiment of the invention. This embodiment is said to be colinear because the microwave channel and bias signals and the modulated light signal lie symmetrically about, or parallel to a hypothetical line drawn through the device. Laser diode 1 is so oriented that light is emitted axially. The diode is mounted on support 2 which is so selected and arranged as to carry heat away from the diode. Normally a metal is selected. Emitted light, shown as a wavy line, passes through optical channel 3, preferably a circular cross section metallic conduit which contains the modulated information-carrying emitted light and shields it from microwaves surrounding light channel 3. The dimensions of the optical channel 1 are selected to provide suitable decay of microwaves, as set out supra. The modulated light may be directed into a matched optical system not shown, such as lenses and/or an optical fiber transmission line, normally within optical channel 3. Modulating microwave signals enter housing 4, which is preferably cylindrical, through side arm 5 as indicated by arrow 6. Entering microwaves resonate in microwave channel 8 which in this embodiment comprises the annular space bounded by housing 4, optical channel 3, movable metallic shorting plane 7 permitting adjustment of the resonant length by means not shown, and support 2. First plastic washer 9 holds optical channel 3 in electrical contact with metal washer and tab 10a which abut fixed second plastic washer 11a. Second plastic washer 11a has a hole permitting the passage of emitted light into optical channel 3, and a slot to accommodate the tab of metal washer 10a and optional capacitor 12. Capacitor 12 is in electrical series relationship with said tab and laser diode 1. Metal washer 10a serves to transmit microwave signals resonating in channel 8 and cooperates to direct them to laser diode 1. Microwaves pass through first and second plastic washers 9 and 11a, which are transparent to microwaves, and cycle through the device as shown by arrows 13, 14, and 15. The direction reverses each half cycle, of course. Optionally a bias, normally d.c., can be impressed on laser diode 1 by means of bias post 16 via electrical connection as shown. Bias post 16 is supported and insulated by dielectric 17. Electrical connection from optional capacitor 12 to bias post 16, functions interalia as an inductive choke to the microwave signals which attempt to flow toward bias post 16. Residual signals at the bias post are diverted back towards the resonator space 8 via the capacitor formed by the annular dielectric 17, and the conductors bias post 16 and threaded section 18. Threaded section 18 and hexagonal faces 19 are optional means for mounting the device.

See FIG. 3 for an exploded view showing the arrangement of second plastic washer 11a, metal washer and tab 10a, optional capacitor 12, and optical channel 3.

FIG. 2 shows a colinear preferred embodiment of the invention. Numbers less than 20 have the same meanings as in FIG. 2. In this embodiment, laser diode 1 is oriented so that light is emitted axially as before. However, in this case emitted light, also shown as a wavy line, passes out of the device through an optical channel 31, an opening through mounting means 18 and 19. The dimensions of the opening are so selected as to provide suitable attenuation of microwaves possibly present, as in the embodiment of FIG. 1. The light in threaded section 18 may be directed into a matched optical system not shown, such as lenses and/or an optical fiber transmission line.

Modulating microwave signals enter housing 4 which is preferably cylindrical, through side arm 5 as indicated by arrow 6. Entering microwaves resonate alternately in the direction of arrows 15 and opposite thereto in channel 8 which, in this embodiment comprises the annular space bounded generally by housing 4, bias post 16, movable metallic shorting plane 7, which permits adjustment of the resonant length by means not shown, and support 2. Plastic washer 11b, which differs slightly from the second plastic washer 11a of FIG. 1 in that the slot more closely approaches the center axis. Comparison of FIGS. 3 and 4 shows the minor differences in plastic washers 11a and 11b and washer and tab 10a and 10b in the two embodiments. Washer and tab 10b is in electrical communication, via a connecting wire as shown, with laser diode 1 in one direction and, in the other direction, with stud 32. Stud 32 is normally bonded to washer 10 and is further held in place by thin plastic washer 33 which in turn is held in place by generally cylindrical cap 34. In electrical contact with stud 32 is bias post 16 which is insulated from shorting plane 7 by means of thin plastic insulation 35. This arrangement isolates microwave signals from the bias signal by virtue of a capacitive effect similar to that described in connection with bias post 16 of FIG. 1.

FIG. 4 is an exploded view showing the arrangement of plastic washer 11b, metallic washer and tab 10b, stud 32, thin plastic washer 33, and bias post 16.

The embodiment of FIG. 2 is preferred over the embodiment of FIG. 1 because the length of the optical channel can be optimized, as described supra, independently of the length of the microwave channel. Other advantages also result. For example, the absence of a center hole in second plastic washer 11 permits a deeper slot and hence the use of a shorter conductor connecting washer and tab 10b with laser diode 1. Shortening the conductor reduces undesirable series inductance thus increasing microwave coupling efficiency to the laser diode.

FIG. 5 shows a further embodiment of the invention wherein the bias and the optical channel are colinear but the microwave channel is perpendicular to the other two.

In this figure, numbers less than 60 have the meanings assigned them in connection with the other figures.

Modulating microwave signals approach the assembly comprising components numbered 10b, 11b, 18, 19, 31, 32, 33, and 34, sometimes called the "package", which may be identical with that of FIG. 2, and resonate in the cavity, adjusted by metallic shorting plane 7, in the direction of the arrows 15 and opposite thereto. The housing 4 in this embodiment, by way of illustration, is shown to be rectangular in cross section.

The bias post 16 is provided with a capacitative shunt to exclude microwave signals from the bias signal through a relatively large insulated portion of the wall 60. Insulation 35 is provided to insulate the bias post from the housing. The portion of bias post 16, which lies within the cavity, functions interalia as an antenna which picks up the microwave signals and conducts them via stud 32, washer and tab 10b, and the connecting wire to laser diode 1.

Optical channels may be waveguides which are well know articles of commerce. Often they are extruded from OHFC copper and are plated with silver on the inside. Cylindrical channels are preferred. Dielectric materials, such as those shown in drawings, are preferably low-loss, low permittivity materials such as poly (tetra-fluoroethylene)/fiberglass composites.

That which is claimed is:

1. A laser diode system for modulating microwave signals wherein microwave signals of at least about 5 GHz frequency are caused to impinge on a laser diode, whereby said singals are translated to optical output consistent with the microwave signal, said system comprising a microwave channel for bringing microwave signals to said diode, a bias post for imposing a direct current bias signal on said diode, and an optical channel for carrying said optical signal out of the device, wherein said microwave channel comprises an annular space between said optical channel and a housing enclosing said system, and wherein said microwave channel, said bias post and said optical channel are colinear and said optical channel comprises means for essentially suppressing the propagation of microwave signals adventitiously present in said optical channel.

2. A laser diode system for modulating microwave signals wherein microwave signals of at least about 5 GHz frequency are caused to impinge on a laser diode, whereby said singals are translated to optical output consistent with the microwave signal, said system comprising a microwave channel for bringing microwave signals to said diode, a bias post for imposing a direct current bias signal on said diode, and an optical channel for carrying said optical signal out of the system, wherein said microwave channel comprises an annular space between said bias post and a housing enclosing said system, and wherein said microwave channel, said bias post and said optical channel are colinear and said optical channel comprises means for essentially suppressing the propagation of microwave signals adventitiously present in said optical channel.

* * * * *